United States Patent
Yamakawa et al.

(10) Patent No.: US 11,702,734 B2
(45) Date of Patent: Jul. 18, 2023

(54) METHOD FOR FORMING RUTHENIUM FILM AND APPARATUS FOR FORMING RUTHENIUM FILM

(71) Applicant: Tokyo Electron Limited, Tokyo (JP)

(72) Inventors: Shunji Yamakawa, Hsin-chu (TW); Tadahiro Ishizaka, Nirasaki (JP); Kohichi Satoh, Nirasaki (JP); Masato Araki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/453,528

(22) Filed: Nov. 4, 2021

(65) Prior Publication Data

US 2022/0145451 A1 May 12, 2022

(30) Foreign Application Priority Data

Nov. 9, 2020 (JP) .................. 2020-186700

(51) Int. Cl.
  *C23C 16/06* (2006.01)
  *C23C 16/18* (2006.01)
  *C23C 16/52* (2006.01)
  *C23C 16/455* (2006.01)

(52) U.S. Cl.
  CPC ........ *C23C 16/18* (2013.01); *C23C 16/45557* (2013.01); *C23C 16/52* (2013.01)

(58) Field of Classification Search
  CPC ......... C23C 16/06; C23C 16/14; C23C 16/18; C23C 16/45557
  See application file for complete search history.

(56) References Cited

U.S. PATENT DOCUMENTS

| | | | | |
|---|---|---|---|---|
| 7,592,259 | B2* | 9/2009 | Dordi | C25D 7/123 |
| | | | | 438/650 |
| 9,230,983 | B1* | 1/2016 | Sharangpani | C23C 16/45525 |
| 9,990,940 | B1* | 6/2018 | Kang | G11B 5/7379 |
| 9,990,951 | B2* | 6/2018 | Lu | G11B 5/66 |
| 2005/0238808 | A1* | 10/2005 | Gatineau | C23C 16/14 |
| | | | | 427/248.1 |
| 2008/0268635 | A1* | 10/2008 | Yu | H01L 21/76877 |
| | | | | 438/655 |
| 2009/0004850 | A1* | 1/2009 | Ganguli | C23C 16/45523 |
| | | | | 438/655 |
| 2010/0227476 | A1* | 9/2010 | Peck | C23C 16/40 |
| | | | | 257/E21.295 |
| 2011/0027977 | A1* | 2/2011 | Li | H01L 21/76846 |
| | | | | 438/584 |
| 2011/0318488 | A1* | 12/2011 | Saito | C23C 16/45553 |
| | | | | 556/136 |
| 2018/0254181 | A1* | 9/2018 | Ishizaka | H01L 21/76883 |
| 2019/0071344 | A1* | 3/2019 | Otter | C03B 5/06 |

FOREIGN PATENT DOCUMENTS

| | | |
|---|---|---|
| JP | 2020-047864 A | 3/2020 |
| JP | 2020-059916 A | 4/2020 |

OTHER PUBLICATIONS

Wang, Hongtao, et al., "Atomic Layer Deposition of Ruthenium Thin Films from an Amidinate Precursor". Chemical Vapor Deposition, 2009, 15, 312-319.*
Gatineau, Julien, et al., "Area-Selective Atomic Layer Deposition of Ruthenium Using a Novel Ru Precursor and H2O as a Reactant". Surface & Coatings Technology 201 (2007) 9146-9148.*
Gaur, Ruchi, et al., "Ruthenium complexes as precursors for chemical vapor-deposition (CVD)". RSC Advances, 2014, 4, 33785-33805.*
Siddiqi, M. Aslam, et al., "Thermal Stability and Sublimation Pressures of Some Ruthenocene Compounds". Materials, 2010, 3, 1172-1185.*
Kim, Hye-Mi, et al., "Area-Selective Atomic Layer Deposition of Ruthenium Using a Novel Ru Precursor and H2O as a Reactant". Chemistry of Materials, 2021, 33, 4353-4361.*
Vasilyev, V. Yu., et al., "Low-Temperature Pulsed CVD of Thin Layers of Metallic Ruthenium for Microelectronics and Nanoelectronics. Part 3: Nucleation Phenomena during the Growth of Ruthenium Layers". Russian Microelectronics, 2010, vol. 39, No. 4, pp. 262-272.*
Gatineau, Julien, et al., "Deposition of highly pure ruthenium thin films with a new metal-organic precursor". Surface and Coatings Technology 201 (2007) 9146-9148.*
Gaur, Ruchi, et al., "Ruthenium complexes as precursors for chemical vapor-deposition (CVD)". Royal Society of Chemistry Advances, 2014, 4, 33785-33805.*

* cited by examiner

*Primary Examiner* — Bret P Chen
(74) *Attorney, Agent, or Firm* — Armstrong Teasdale LLP

(57) ABSTRACT

A method of forming a ruthenium film on a surface of a substrate in order to embed ruthenium in a recess formed in the surface of the substrate includes depositing ruthenium by supplying a ruthenium raw material gas to the substrate under a preset first pressure, and depositing the ruthenium by supplying the ruthenium raw material gas to the substrate under a preset second pressure, which is lower than the first pressure. The ruthenium film is formed by alternately repeating the depositing the ruthenium under the first pressure and the depositing the ruthenium under the second pressure.

6 Claims, 11 Drawing Sheets

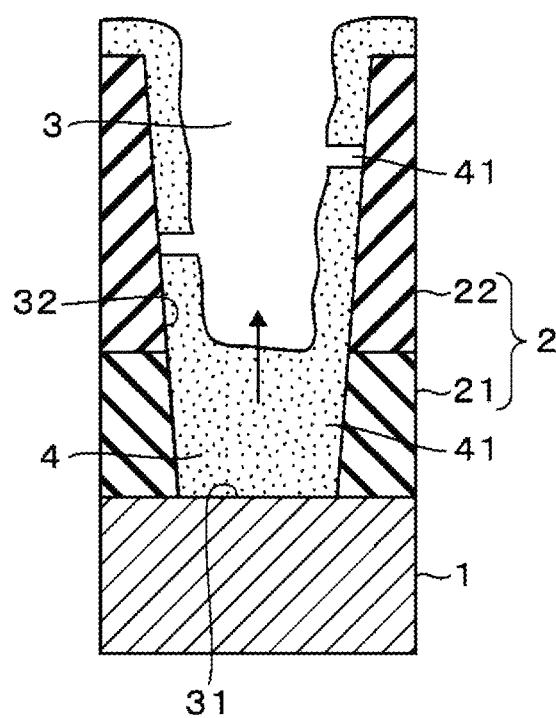

FIG. 6

| Step | 1 | 2 | 3 | 4 | 5 | 6 |
|---|---|---|---|---|---|---|
| Ru Source | | | → | | | → |
| APC Set | Full Open | 13.3Pa | 13.3Pa | Full Open | 2.2Pa | 2.2Pa |

(Example)

(Comparative Example)

METHOD FOR FORMING RUTHENIUM FILM AND APPARATUS FOR FORMING RUTHENIUM FILM

CROSS-REFERENCE TO RELATED APPLICATION

This application is based upon and claims the benefit of priority from Japanese Patent Application No. 2020-186700, filed on Nov. 9, 2020, the entire contents of which are incorporated herein by reference.

TECHNICAL FIELD

The present disclosure relates to a method and an apparatus for forming a ruthenium film.

BACKGROUND

In manufacturing semiconductor devices, a process of forming a metal film on a semiconductor wafer (hereinafter, referred to as a "wafer"), which is a substrate for manufacturing the semiconductor devices, is performed. As this metal film, a ruthenium (Ru) film may be formed. Patent Document 1 and Patent Document 2 disclose a process for embedding a Ru film in a recess formed in a wafer.

PRIOR ART DOCUMENT

Patent Document

[Patent Document Japanese Laid-Open Patent Publication No. 2020-59916

[Patent Document Japanese Laid-Open Patent Publication No. 2020-47864

SUMMARY

According to the embodiments of the present disclosure, there is provided a method of forming a ruthenium film on a surface of a substrate in order to embed ruthenium in a recess formed in the surface of the substrate, the method including: depositing ruthenium by supplying a ruthenium raw material gas to the substrate under a preset first pressure; and depositing the ruthenium by supplying the ruthenium raw material gas to the substrate under a preset second pressure, which is lower than the first pressure, wherein the ruthenium film is formed by alternately repeating the depositing the ruthenium under the first pressure and the depositing the ruthenium under the second pressure

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4B is a second vertical cross-sectional view illustrating a step of the film forming method of the embodiment.

FIG. 6 is an explanatory view illustrating steps of the film forming method according to the embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a method of forming a ruthenium film of the present disclosure will be described. The present disclosure relates to a process of forming a Ru film on the surface of a wafer, which is a substrate, in order to embed ruthenium (Ru) in a recess formed in the surface of the wafer. In the present disclosure, as a material for filling a recess such as a via hole or a trench, instead of conventionally used tungsten (W), Ru, which has a resistance value lower than that of W, is used.

With device structures becoming miniaturized and complicated, recesses are becoming smaller in opening width and larger in depth. When a Ru film is formed in such a recess having a high aspect ratio (e.g., an aspect ratio in the range of about 6 to 10), a void tends to be easily generated due to the characteristics of a raw material gas of Ru. When a void is present in Ru embedded in a recess, a region through which current flows becomes narrow and thus the resistance value of the region rises. The present disclosure has been made to achieve an improvement in this point, and is a technique for embedding Ru in a recess while suppressing the generation of a void.

Comparative Embodiment

Figure 1:
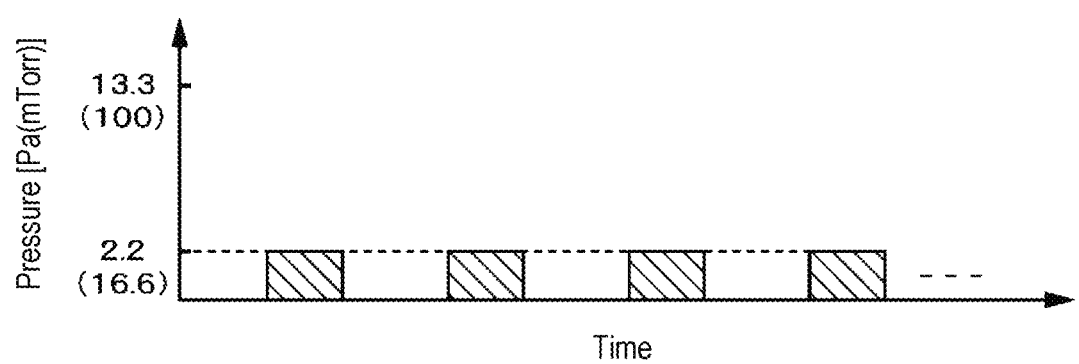
FIG. 1 is a characteristic diagram illustrating a gas supply sequence of a film forming method of a comparative embodiment.
Figure 2A:
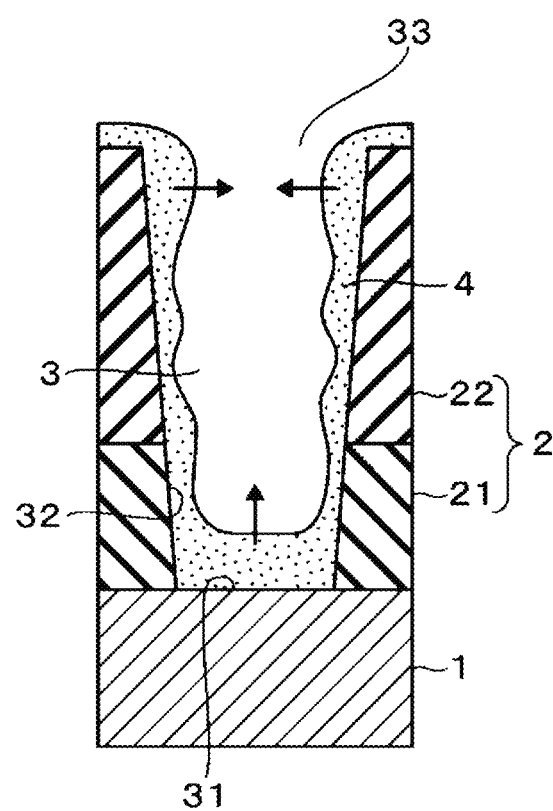
FIG. 2A is a first vertical cross-sectional view illustrating a step of a film forming method of the comparative embodiment.

Prior to describing an embodiment of the present disclosure, a method of forming a Ru film in a comparative embodiment will be described with reference to FIG. 1 and FIGS. 2A to 2C. As illustrated in FIG. 2A, a film formation target has a surface structure in which an insulating film 2 is laminated on a metal film 1 formed on the surface of a wafer and a recess 3 is formed in the insulating film 2. The recess 3 is formed by removing a portion of the insulating film 2 formed on the surface of the wafer. In this device structure, the metal formed at the lower layer side of the insulating film 2 is exposed on the bottom surface 31 of the recess 3, and the side wall 32 of the recess 3 is formed by the insulating film 2. In this example, a case in which the metal film 1 is a tungsten (W) film and the insulating film 2 is a laminated film of a silicon nitride film (SiN film) 21 and a silicon oxide film ($SiO_2$ film) 22 will be described as an example.

In the film forming method of this comparative embodiment, step A of depositing Ru by adjusting a processing atmosphere in which a wafer is placed to a preset pressure and supplying a ruthenium raw material gas (a Ru raw material gas) to the wafer under this pressure for a predetermined period is carried out. FIG. 1 illustrates a supply sequence of a Ru raw material gas, in which the vertical axis represents pressure in processing atmosphere and the horizontal axis represents time. The shaded regions indicate the periods during which step A for depositing Ru is carried out.

In addition, after this step A, a step of removing the Ru raw material gas in the processing atmosphere by exhausting the processing atmosphere in which the wafer is placed is carried out. Next, step A of depositing Ru is carried out again by adjusting the processing atmosphere to the set pressure again and supplying the Ru raw material gas. In this example, a Ru film is formed by using an atomic layer deposition (ALD) method, and a process of embedding Ru in the recess 3 is performed by repeating step A of depositing Ru and the step of removing the Ru raw material gas.

In this example, for example, dodecacarbonyl triruthenium gas ($Ru_3(CO)_{12}$) is used as the Ru raw material gas, and the pressure in step A of depositing Ru is set to a pressure in the range of 0.6 Pa to 13.3 Pa, for example 2.2 Pa (16.6 mTorr). However, it was found that when the Ru film was formed under these conditions, voids were likely to be generated when the Ru film was embedded in the recess 3.

Figure 2B:
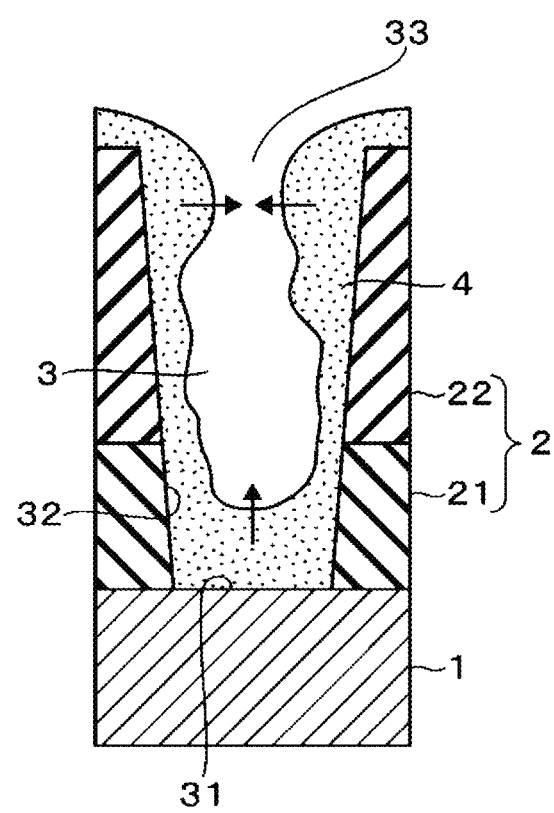
FIG. 2B is a second vertical cross-sectional view illustrating a step of a film forming method of the comparative embodiment.
Figure 2C:
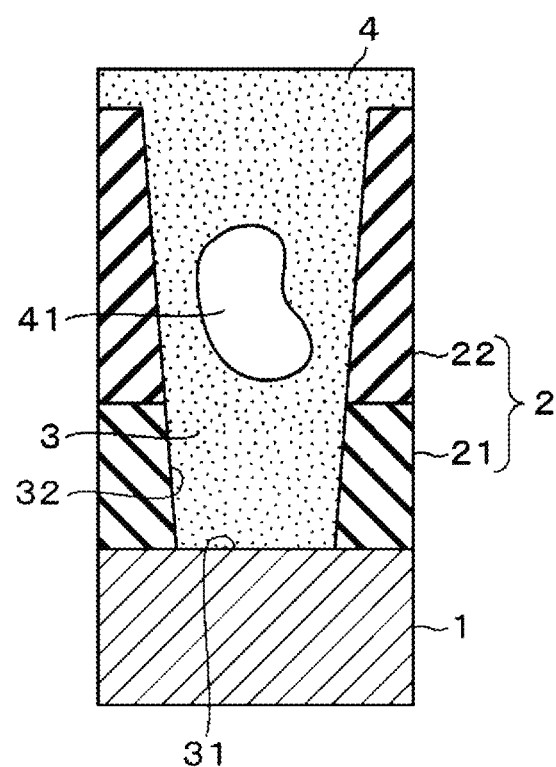
FIG. 2C is a third vertical cross-sectional view illustrating a step of a film forming method of the comparative embodiment.

FIGS. 2A to 2C are cross-sectional views of a wafer illustrating a process of embedding Ru in the comparative embodiment, and a film formation mechanism in the comparative embodiment will be considered with reference to these figures. When film formation is performed under the pressure described above, as illustrated in FIG. 2A, a Ru film grows at a high film forming rate on the bottom surface 31 of the recess 3 in which a metal W film is exposed. The Ru film grows at a small film forming rate on the side wall 32 of the recess 3 formed of the insulating film 2, but the roughness of the Ru film 4 at the side wall side becomes larger. The reason why the roughness becomes larger is that in the film formation of the Ru film 4 using the Ru raw material gas, nuclei are first formed to be scattered on the surface of the side wall formed of the insulating film 2, and the Ru film 4 grows around these nuclei. Therefore, on the surface of the side wall 32 of the recess 3, Ru is deposited in a convex shape around the nuclei. It is presumed that the roughness becomes larger because these convex deposits grow to be connected with each other to form the Ru film 4.

Then, as described above, by alternately repeating step A of depositing Ru and the step of removing the Ru raw material gas, the unevenness of the Ru film 4 formed on the side wall 32 becomes larger in the recess 3 while the Ru film 4 is gradually embedded in the recess 3. In this way, each time the film formation is repeated, at the side wall 32 side of the recess 3 at which the roughness of the Ru film 4 is large, the Ru film 4 protrudes from the side wall 32 side in the opening 33 of the recess 3 as illustrated in FIG. 2B, and thus the opening 33 of the recess 3 is narrowed.

In addition, in the recess 3 having a high aspect ratio, the Ru raw material gas does not easily enter the recess 3, and as illustrated in FIG. 2B, the Ru film 4 is likely to be deposited near the opening 33 of the recess 3. Therefore, the opening 33 of the recess 3 is further narrowed, and it becomes more difficult for the Ru raw material gas to enter the interior of the recess 3. As a result, it is presumed that, in combination with the increase in the roughness of the Ru film 4 formed on the side wall 32 of the recess 3 as well, the Ru film 4 is embedded in the recess 3 in the state in which a void 41 is generated as illustrated in FIG. 2C.

Embodiment of the Present Disclosure

Figure 3:
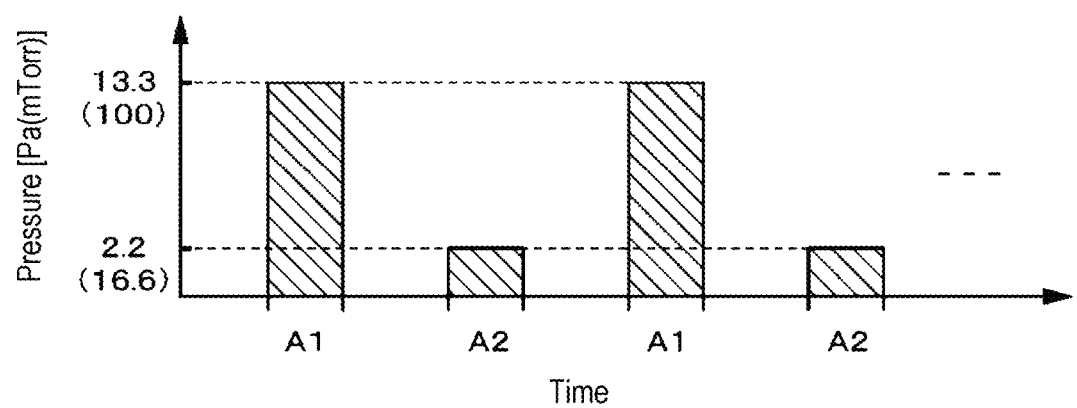
FIG. 3 is a characteristic diagram illustrating a gas supply sequence of an embodiment of a film forming method according to the present disclosure.

Subsequently, an embodiment of a Ru film forming method of the present embodiment will be described with reference to FIG. 3 and FIGS. 4A to 4C. In this example, a step of depositing Ru by supplying a Ru raw material gas to a wafer as a film formation target under a first pressure and a step of depositing Ru by supplying the Ru raw material gas to the wafer under a second pressure are alternately repeated. These steps are performed by adjusting the pressure of the processing atmosphere in which the wafer is placed to a set value and supplying the Ru raw material gas. The first pressure and the second pressure are preset pressures, respectively, and the second pressure is set to be lower than the first pressure. FIG. 3 illustrates an example of a supply sequence of a Ru raw material gas, in which the vertical axis represents pressure in processing atmosphere and the horizontal axis represents time. The shaded regions indicate the periods during which the Ru raw material gas is supplied.

In this example, first, step A1 of depositing Ru under the first pressure (first deposition step) is carried out. In FIG. 3, the period for supplying the Ru raw material gas under the first pressure (e.g., 13.3 Pa (100 mTorr)) corresponds to the first deposition step A1. Next, a step of removing the Ru raw material gas supplied to the wafer from the surface of the wafer is carried out. This step is performed by exhausting the processing atmosphere in which the wafer is placed to discharge the Ru raw material gas in the processing atmosphere.

Next, step A2 of depositing Ru under the second pressure (second deposition step) is carried out. In FIG. 3, the period for supplying the Ru raw material gas under the second pressure (e.g., 2.2 Pa (16.6 mTorr)) corresponds to the second deposition step A2. Subsequently, a step of removing, from the surface of the wafer, the Ru raw material gas supplied to the wafer is carried out. In this way, a film formation process of embedding Ru in the recess 3 by using the ALD method is performed by alternately repeating the first deposition step A1 and the second deposition step A2 while carrying out the step of removing the Ru raw material gas between the two deposition steps A1 and A2.

In this embodiment, the Ru raw material gas supplied in the first deposition step A1 and the Ru raw material gas supplied in the second deposition step A2 are the same gas. For example, dodecacarbonyl triruthenium ($Ru_3(CO)_{12}$) may be used. In this example in which $Ru_3(CO)_{12}$ gas is used as the Ru raw material gas, the first pressure is set to a pressure in the range of 13.3 Pa to 20.0 Pa, for example, 13.3 Pa (100 mTorr), and the second pressure is set to a pressure in the range of 0.6 Pa to 2.2 Pa, for example, 2.2 Pa (16.6 mTorr). Since the first pressure is relatively higher than the second pressure, the film formation condition of the first deposition step may be described as a "high-pressure condition", the film formation of the first deposition step may be described as "film formation under a high-pressure condition", the film formation condition of the second deposition step may be described as a "low-pressure condition", and the film formation of the second deposition step may be described as "film formation under a low-pressure condition".

Figure 4A:
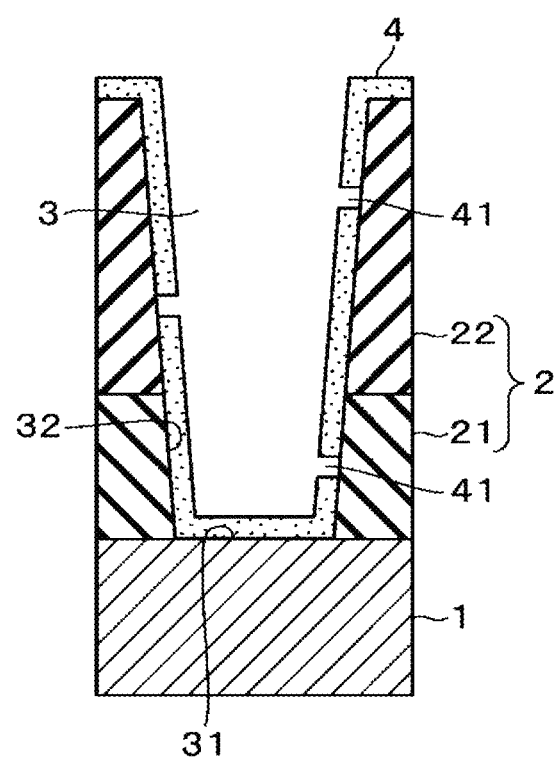
FIG. 4A is a first vertical cross-sectional view illustrating a step of the film forming method of the embodiment.
Figure 4C:
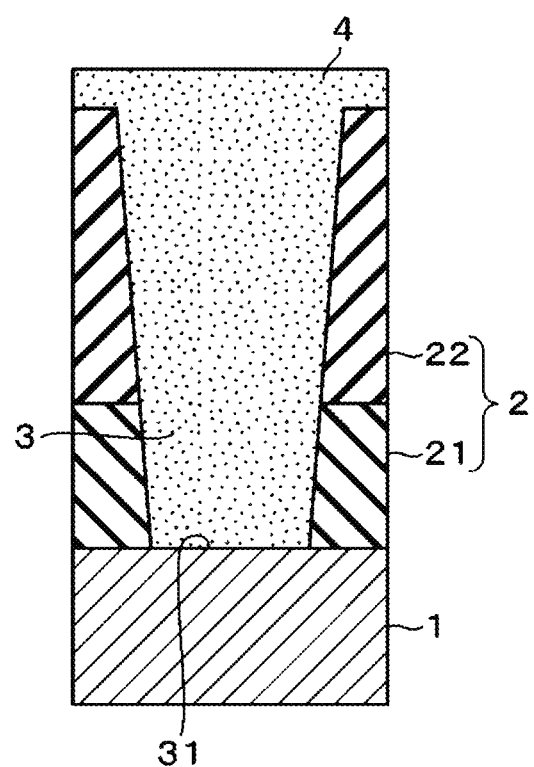
FIG. 4C is a third vertical cross-sectional view illustrating a step of the film forming method of the embodiment.

FIGS. 4A to 4C are cross-sectional views illustrating a Ru embedding process of this embodiment, and a mechanism of forming a Ru film will be considered with reference to these figures. FIG. 4A illustrates a state in which a Ru film is formed in the recess 3 in the first deposition step A1. When a film is formed under the high-pressure condition, the growth rate of the Ru film 4 is almost the same on both the metal film 1 forming the bottom surface 31 of the recess 3 and the insulating film 2 forming the side wall 32 of the recess 3. However, the growth rate of the Ru film 4 is lower than that under the low-pressure condition to be described later. In addition, due to high conformity to the shape of the recess 3, a thin Ru film 4 having high uniformity in film thickness is formed. As described above, under the high-pressure condition, a Ru film 4 having improved flatness and continuity and small roughness compared with the film formation under the low-pressure condition is formed. However, as illustrated in FIG. 4A, minute holes (defects) 41 may be formed to be scattered in corresponding regions of the SiN film 21 and the $SiO_2$ film 22 forming the side wall 32 of the recess 3.

FIG. 4B illustrates the state in which the Ru film 4 is formed in the recess 3 in the second deposition step A2. In this step, the film formation is performed under the low-pressure condition having the same pressure as the comparative embodiment. Therefore, as described above, the Ru film 4 grows from the bottom surface 31 of the recess 3 at a high film forming rate to raise the bottom surface 31 of the recess 3 (bottom-up). At this time, the growth rate of the Ru film 4 is higher than that under the high-pressure condition described above. By the formation of the Ru film 4 from the bottom surface 31 side, the holes 41 formed at the side wall 32 side in the first deposition step A1 are filled.

In the second deposition step A2, since the film formation is performed under the low-pressure condition, conformity to the shape of the side wall 32 of the recess 3 is slightly reduced, but the film grows on the Ru film 4 formed under the high-pressure condition and having high conformity to the shape of the side wall 32. Therefore, compared with the case in which only the film formation under the low-pressure condition is performed as in the comparative embodiment, the unevenness of the Ru film 4 on the side wall 32 of the recess 3 is suppressed, and the roughness is reduced. In addition, since an improvement is achieved in terms of the roughness of the Ru film 4 on the side wall 32 of the recess 3, it is possible to suppress the protrusion of the Ru film 4 from the side wall 32 in the opening 33 of the recess 3. Therefore, the narrowing of the opening 33 due to the deposition of the Ru film 4 in the vicinity of the opening 33 of the recess 3 is suppressed. In the second deposition step A2, the Ru film 4 is formed to raise the bottom of the recess 3 as described above. As a result, even if the opening 33 of the recess 3 is narrowed as the film formation progresses, a sufficient amount of Ru raw material gas may reach the bottom surface side of the Ru film 4 during the film formation in the recess.

In this way, formation of the Ru film 4 having a uniform film thickness due to the high conformity to the shape of the recess 3 in the first deposition step A1 and formation of the Ru film 4 for raising the bottom surface of the recess 3 while filling the minute holes 41 in the second deposition step A2 are alternately repeated. As a result, the formation of the Ru film proceeds in the state in which voids are unlikely to be formed in the recess 3. As a result, as illustrated in FIG. 4C, it is presumed that the Ru film 4 can be embedded in the recess 3 in the state in which the formation of voids is suppressed.

As described above, the technique of the present disclosure was made based on the finding that effects on embedding Ru in the recess 3 vary depending on the pressure at the time of supplying the Ru raw material gas in performing film formation for embedding Ru in the recess 3. In a case where the supply flow rates of the Ru raw material gas are the same in the first deposition step and the second deposition step, since the first pressure is higher than the second pressure, the film forming rate on the inner wall of the recess 3 is reduced as described above. The reason for this is that since the amount of sublimation of a solid raw material 59 in a raw material bottle 58 is substantially constant, the flow rate of CO gas, which is a carrier gas, is increased when the pressure is increased. Therefore, when the pressure is increased, the concentration of the Ru raw material gas in a raw material gas, which is a mixed gas of the Ru raw material gas and the CO gas, is lowered, and the film forming rate is lowered. As a result, the film formation of the Ru film proceeds slowly, so that a Ru film having a high uniformity in film thickness and conforming to the shape of the recess 3 is formed. It is presumed that since the film forming rate is low, the Ru film 4 having a substantially uniform film thickness is formed on the metal film 1 forming the bottom surface 31 of the recess 3 and the insulating film 2 forming the side wall 32 of the recess 3.

When film formation is only performed under a high-pressure condition, minute holes 41 may remain, and as a result, the resistance value may increase. In addition, since the Ru film is formed to conform to the shape of the recess 3, the opening 33 of the recess 3 may be narrowed in the recess 3 having a high aspect ratio as the film formation progresses. Therefore, the Ru raw material gas may not enter the bottom surface side of the recess 3, and as a result, elongated voids may be generated. As described above, in either a case where only the film formation under the high-pressure condition is performed or a case where only the film formation under the low-pressure condition is performed, it is difficult to embed a Ru film 4 in a recess 3 in the state in which the generation of voids 41 is suppressed. In contrast, according to the film forming method of the present disclosure described above with reference to FIG. 3 and FIGS. 4A to 4C, it is possible to form a uniform Ru film 4 in which the generation of voids 41 is suppressed by taking advantages of both the high-pressure condition and the low-pressure condition and complementing mutual disadvantages thereof.

<Film Forming Apparatus>

Figure 5:
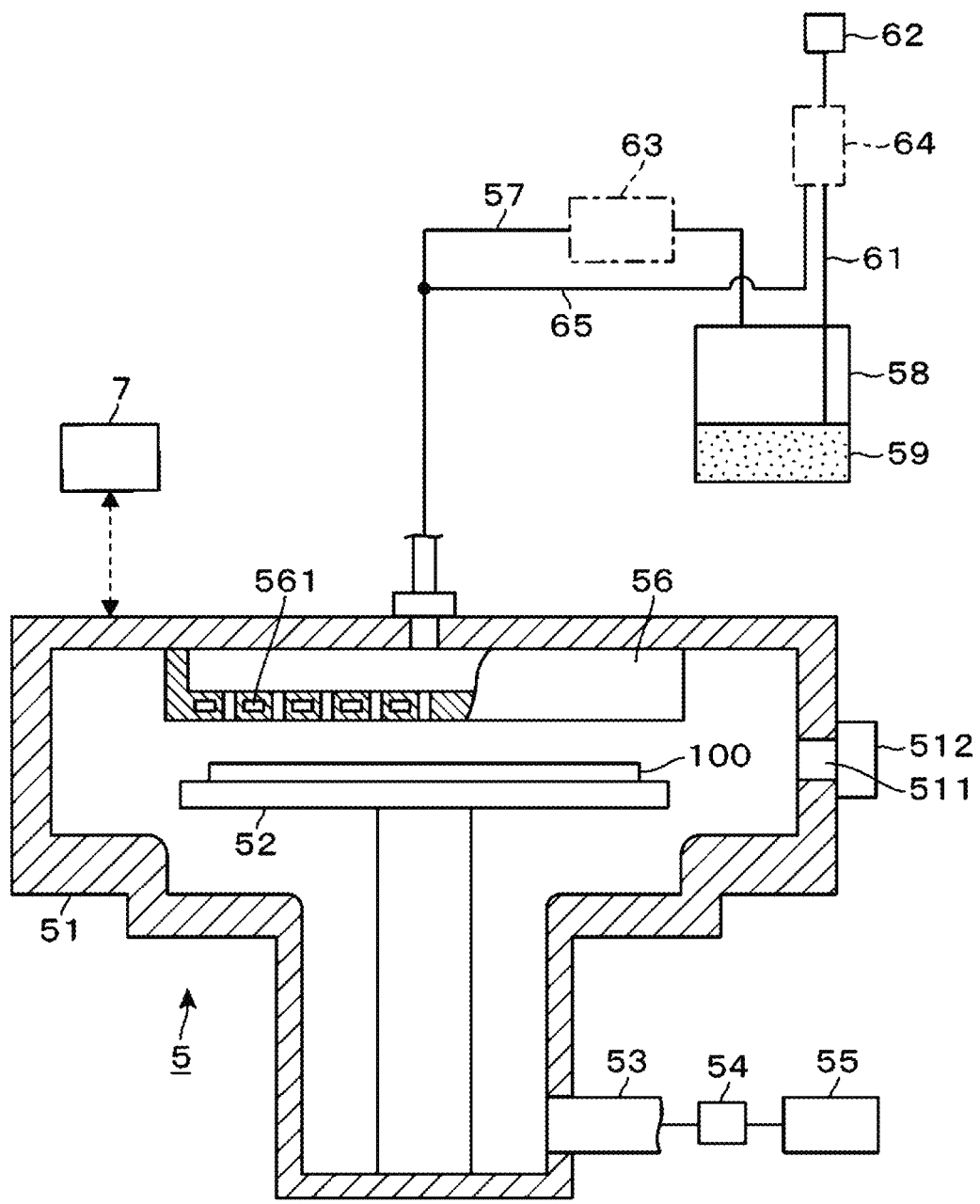
FIG. 5 is a vertical cross-sectional view illustrating a film forming apparatus according to an embodiment.

Subsequently, an embodiment of an apparatus for forming a Ru film of the present disclosure will be described with reference to the vertical cross-sectional view of the film forming apparatus illustrated in FIG. 5. The film forming apparatus 5 includes a processing container 51 in which a carry-in/out port 511 of a wafer W is formed, and a stage 52 in which a heater (not illustrated) is embedded is provided in the processing container 51. In FIG. 5, reference numeral 512 indicates a gate valve configured to open and close the carry-in/out port 511. A wafer 100 is delivered between the stage 52 and an external transfer mechanism (not illustrated) via lifting pins (not illustrated).

The upstream end of an exhaust pipe 53 is open in the processing container 51, and a vacuum exhaust mechanism 55 configured to exhaust the interior of the processing container 51 so as to form a vacuum atmosphere therein is connected to the downstream side of the exhaust pipe 53 via an auto pressure controller (APC) valve 54. The vacuum exhaust mechanism 55 corresponds to an exhauster configured to exhaust the interior of the processing container 51, and the APC valve 54 corresponds to a pressure adjuster configured to adjust the pressure inside the processing container 51.

The APC valve 54 is configured with, for example, a butterfly valve, so that it can open/close the exhaust pipe 53. The APC valve 54 is configured to have a function of adjusting the pressure inside the processing container 51 by increasing or decreasing the conductance of the exhaust pipe 53 by adjusting the opening degree thereof. In this example, respective opening degrees of the APC valve 54 are set as follows: when set to, for example, a first opening degree, the APC valve 54 adjusts the interior of the processing container 51 to a first pressure (e.g., 13.3 Pa), and when set to, for example, a second opening degree, the APC valve 54 adjusts the interior of the processing container 51 to a second pressure (e.g., 2.2 Pa).

A gas shower head 56 is provided in the upper portion of the interior of the processing container 51. Reference numeral 561 in the figure indicates a flow path of a temperature adjustment fluid that is provided in the gas shower head 56. The downstream end of a gas supply path 57 is connected to the gas shower head 56, and the base end side of the gas supply path 57 is connected to the raw material bottle 58. For example, powder 59 of $Ru_3(CO)_{12}$ is contained in the raw material bottle 58. In addition, the downstream end of a gas supply path 61 is open in the raw material bottle 58, and the upstream end of the gas supply path 61 is connected to a source 62 of carbon monoxide (CO) gas which is a carrier gas.

When the carrier gas is supplied to the raw material bottle 58 in the above configuration, the $Ru_3(CO)_{12}$ is sublimated, and the $Ru_3(CO)_{12}$ gas is supplied to the gas shower head 56 together with the carrier gas, so that film formation of a Ru film is performed. Reference numerals 63 and 64 in FIG. 5 indicate a group of gas supply devices, which are provided in the gas supply paths 57 and 61, respectively, and include a valve and a flow rate adjuster. Reference numeral 65 in FIG. 5 indicates a carrier gas supply path used when only CO gas, which is a carrier gas, is supplied to the processing container 51. In this case, the gas supply device 64 is configured to be able to cover each of supply of only CO gas to the processing container 51 and supply of a mixed gas of a Ru raw material gas and CO gas. The raw material gas supplier configured to supply the Ru raw material gas into the processing container 51 includes the gas supply path 57, the raw material bottle 58, the gas supply path 61, and the CO gas source 62.

The film forming apparatus 5 includes a controller 7 which is a computer, and the controller 7 has a program. This program is stored in a non-transitory storage medium such as a compact disk, a hard disk, a magneto-optical disk, or a DVD, and is installed in the controller 7. The controller 7 outputs a control signal to each part of the film forming apparatus 5 based on the program to control the operation of each part. Specifically, this program controls operations such as supply and stop of the Ru raw material gas to the wafer 100, adjustment of the pressure inside the processing container 51, heating of the wafer 100, and the like in the film forming apparatus 5. Then, a group of steps are organized by the program such that a series of processes described with reference to FIG. 3 and FIGS. 4A to 4C can be carried out.

<Ru Film Forming Process>

Subsequently, the operation of the film forming apparatus 5 when performing the processes of the above-described embodiment will be described with reference to FIG. 6. First, the gate valve 512 is opened, and a wafer 100 is transferred onto the stage 52 by an external transfer mechanism through the carry-in/out port 511. As described above, the wafer 100 has, in the surface thereof, a recess 3 into which Ru is to be embedded. The wafer 100 placed on the stage 52 is heated to a temperature in the range of, for example, 100 degrees C. to 250 degrees C. When the wafer 100 is heated in this way, the opening degree of the APC valve 54 is set to full open, so that the interior of the processing container 51 is exhausted to a vacuum state and a waiting time is given for a predetermined period of time in this state ("step S1" in FIG. 6).

In this way, after performing step S1 for a predetermined period of time, the opening degree of the APC valve 54 is set to the first opening degree, and CO gas, which is a carrier gas, is supplied from the carrier gas supply path 65 side by the gas supply device 64. Then, the interior of the processing container 51 is adjusted to a first pressure (e.g., 13.3 Pa) by the supply of CO gas and the action of the APC valve 54 ("step S2" in FIG. 6). Next, in the state in which the APC valve 54 is set to the first opening degree, by switching the gas supply path to the gas supply path 57 side by using the gas supply devices 63 and 64, $Ru_3(CO)_{12}$ gas, which is a Ru raw material gas, is supplied into the processing container 51 via the raw material bottle 58. Then, in the state in which the interior of the processing container 51 is adjusted to the first pressure by the supply of the $Ru_3(CO)_{12}$ gas and the CO gas and the action of the APC valve 54, the first deposition step A1 described above is carried out ("step S3" in FIG. 6). In this step, the $Ru_3(CO)_{12}$ gas is supplied at, for example, 100 sccm to 600 sccm, more specifically, for example, 300 sccm, for 10 to 70 seconds to form a Ru film 4.

After the first deposition step A1 is carried out for a predetermined period of time, the valves of the gas supply devices 63 and 64 are closed to stop the supply of the Ru raw material gas and the CO gas. Subsequently, the opening degree of the APC valve 54 is set to full open, the interior of the processing container 51 is exhausted to a vacuum state and a waiting time is given for a predetermined period of time in this state ("step S4" in FIG. 6). As a result, the Ru raw material gas within the processing container 51 is exhausted through the exhaust pipe 53, and the Ru raw material gas supplied to the wafer 100 is removed from the surface of the wafer 100.

After performing this step S3 for a predetermined period of time, the opening degree of the APC valve 54 is set to the second opening degree, and CO gas is supplied from the carrier gas supply path 65 side by the gas supply device 64. Then, the interior of the processing container 51 is adjusted to the second pressure (e.g., 2.2 Pa) by the supply of the CO gas and the action of the APC valve 54 ("step S5" in FIG. 6). Next, in the state in which the APC valve 54 is set to the second opening degree, $Ru_3(CO)_{12}$ gas, which is a Ru raw material gas, is supplied from the gas supply path 57 side into the processing container 51 by using the gas supply devices 63 and 64. Then, in the state in which the interior of the processing container 51 is adjusted to the second pressure (e.g., 2.2 Pa) by the supply of the $Ru_3(CO)_{12}$ gas and the CO gas and the action of the APC valve 54, the second deposition step A2 described above is carried out ("step S6" in FIG. 6). In this step as well, the $Ru_3(CO)_{12}$ gas is supplied at the same supply flow rate for the same supply time as in the first deposition step A1 to form the Ru film 4.

After the second deposition step A2 is carried out for a predetermined period of time, the valves of the gas supply devices 63 and 64 are closed to stop the supply of the Ru raw material gas and the CO gas. Subsequently, the opening degree of the APC valve 54 is set to full open again, and the interior of the processing container 51 is exhausted ("step S1" in FIG. 6). As a result, the Ru raw material gas within the processing container 51 is exhausted through the exhaust pipe 53, and the Ru raw material gas supplied to the wafer 100 is removed from the surface of the wafer 100.

In this way, as illustrated in FIG. 6, a series of steps including step S1→>step S2→>step S3→>step S4→>step S5→>step S6 are repeated. As a result, the Ru film 4 is formed by alternately repeating the formation of the Ru film 4 in the first deposition step A1 and the formation of the Ru film 4 in the second deposition step A2 a plurality of times.

According to the above-described embodiment, when the Ru film is formed on the surface of the wafer, it is possible to embed Ru in the recess formed in the surface of the wafer while suppressing the formation of voids. Particularly, when Ru is embedded using $Ru_3(CO)_{12}$ gas in a recess having a high aspect ratio and including a bottom surface on which a metal is exposed and a side wall formed by an insulating film, voids are likely to be generated. With the method of the present disclosure, it is possible to effectively embed the Ru film even in a recess in this structure while suppressing the generation of voids.

In addition, since the step of removing the Ru raw material gas supplied to the wafer is carried out between the first deposition step and the second deposition step, the state inside the processing container can be reset, and the film formation under the high-pressure condition and the film formation under the low-pressure condition can be reliably separated and carried out. As the above-described embodiment, when one cycle of the film formation under a high-pressure condition and one cycle of the film formation under a low-pressure condition are alternately carried out, a Ru film is reliably embedded in minute holes generated by the film formation under the high-pressure condition. In the film formation under the high-pressure condition, the film forming rate is low, but in the film formation under the low-pressure condition, the film is formed from the bottom surface of a recess at a high film forming rate. Therefore, it is possible to suppress a decrease in the total throughput of the film forming process for embedding a Ru film in the recess.

<Other Application 1>

In addition to $Ru_3(C))_{12}$ described in the foregoing, (2,4-dimethylpentadienyl) (ethylcyclopentadienyl)ruthenium: (Ru(DMPD)(EtCp)), bis(2,4-dimethylpentadienyl)Ruthenium: (Ru(DMPD)$_2$), 4-dimethylpentadienyl(methylcyclopentadienyl)Ruthenium: (Ru(DMPD)(MeCp)), Bis(Cyclopentadienyl)Ruthenium: (Ru(C$_5$H$_5$)$_2$), Cis-dicarbonyl bis(5-methylhexane-2,4-dionate)ruthenium(II), bis(ethylcyclopentadienyl)Ruthenium(II): Ru(EtCp)$_2$, or the like may be used as the Ru raw material gas for forming the Ru film 4.

It does not matter which one of the first deposition step and the second deposition step is carried out first. However, as exemplified for the $Ru_3(CO)_{12}$ gas in the previous description, there exist appropriate pressure ranges for the first pressure and the second pressure, respectively. The appropriate pressure ranges are set for the first pressure and the second pressure, respectively, corresponding to various Ru raw material gases. In the above-described embodiment, performing the film formation under the high-pressure condition once and performing the film formation under the low-pressure condition once are alternately carried out, but the present disclosure is not limited thereto. The ratio between the number of times the first deposition step is carried out and the number of times the second deposition step is carried out may be changed. For example, a case having a cycle in which the film formation under the high-pressure condition is carried out once, and the film formation under the low-pressure condition is carried out twice may be possible. In this case, a series of cycles consisting of: film formation under high-pressure condition-→exhaust of Ru raw material gas→film formation under low pressure condition→exhaust of Ru raw material gas-→film formation under low pressure condition→exhaust of Ru raw material gas will be repeated.

In the above-described embodiment, both the first deposition step and the second deposition step are carried out without changing the temperature of the wafer, the supply flow rate or the supply time of the Ru raw material gas during the film formation process. However, the present disclosure is not limited thereto, and at least one of the temperature of the wafer, the supply flow rate and the supply time of the Ru raw material gas during the film forming process may be changed in the first deposition step and the second deposition step. In the foregoing, the present disclosure also includes a case in which a step of depositing Ru by supplying the Ru raw material gas under a third pressure different from the first pressure and the second pressure is carried out in addition to the first deposition step and the second deposition step. That is, in depositing Ru on a substrate, it is sufficient to carry out at least the first deposition step and the second deposition step, and the present disclosure is applicable even when the Ru film is formed under three or more different pressure conditions.

In the present disclosure, for example, titanium nitride (TiN), tantalum nitride (TaN), titanium (Ti), or the like may be formed before the Ru film is formed on the inner surface of the recess. The TiN or the like forms nuclei for the growth of the Ru film when the Ru film is formed in the subsequent step, and promotes the formation of the Ru film. However, if the entire inner surface of the recess 3 is covered with a TiN film or the like at the time of forming TiN or the like, the above-described effects due to the difference between the materials for constituting the bottom surface 31 (the metal film 1) and the side wall 32 (the insulating film 2) of the recess 3 may not be fully exhibited. Therefore, when the TiN or the like is formed in the recess 3, it is preferable to keep the TiN or the like in the state of being dispersed on the inner surface of the recess 3. In addition, in the present disclosure, the metal film forming the bottom surface of the recess is not limited to the tungsten film.

<Other Application 2>

It shall be understood that the embodiments disclosed herein are examples in all respects and are not restrictive. The above-described embodiments may be omitted, replaced, modified, or combined in various forms without departing from the scope and spirit of the appended claims.

EXAMPLES

An evaluation test was conducted to verify the effects of the film forming method according to the present disclosure.

EXAMPLE

A Ru film 4 was formed on a wafer 100 according to the Ru film forming method according to the embodiment described with reference to FIGS. 3 and 6 described above. The wafer 100 has a structure illustrated in FIG. 4A, which includes a W film as the metal film 1 and a SiN film 21 and a SiO$_2$ film 22 as the insulating film 2 and includes a recess 3 formed therein. Referring to FIG. 4A, the width d1 of the bottom surface of the recess 3 is 9 nm, the width d2 of the opening 33 of the recess 3 is 15 nm, and the depth d3 of the recess 3 is 60 nm (the thickness of the SiN film 21 is 20 nm, and the thickness of the SiO$_2$ film 22 is 40 nm).

The first pressure was 13.3 Pa, the second pressure was 2.2 Pa, the supply flow rate of the Ru$_3$(CO)$_{12}$ gas in the first deposition step (step 3) and the second deposition step (step 6) were both 300 sccm, the supply time was 35 sec, and the temperature of the wafer 100 was 155 degrees C. In addition, each of the processing times in the steps of removing the Ru$_3$(CO)$_{12}$ gas (step S1 and step S4) and the steps of adjusting the pressure (steps S2 and S5) carried out between the first deposition step and the second deposition step was 60 sec.

Figure 7A:
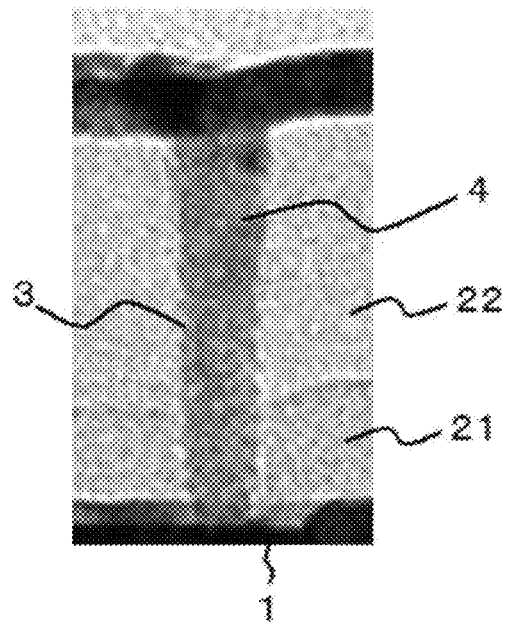
FIG. 7A is an explanatory diagram showing an image acquired in an evaluation test according to an example.

Under the above-mentioned conditions, the cycle of carrying out the first deposition step and the second deposition step was repeated 9 times to perform the film forming process described above. Next, an image of a vertical cross section of the wafer 100 after the film forming process was acquired by a method called high-angle annular dark field (HAADF) using a transmission electron microscope (TEM). This image is shown in FIG. 7A.

COMPARATIVE EXAMPLE

A Ru film 4 was formed on a wafer having a structure illustrated in FIG. 2A, which was configured in the same manner as in the embodiment, according to the Ru film forming method in the comparative embodiment described with reference to FIG. 1 described above. The shape of the recess 3 in FIG. 2A is the same as the shape of the recess 3 in FIG. 4A.

The pressure inside the processing container when supplying the Ru$_3$(CO)$_{12}$ gas in the comparative embodiment was 2.2 Pa, the supply flow rate of the Ru$_3$(CO)$_{12}$ gas was 300 sccm, the supply time was 35 sec, and the temperature of the wafer 100 was 155 degrees C. In addition, the step of forming a Ru film by supplying the Ru$_3$(CO)$_{12}$ gas and the step of exhausting the interior of the processing container 51 by stopping the supply of the Ru$_3$(CO)$_{12}$ gas, and setting the opening degree of the APC valve 53 to full open were alternately carried out, and the exhaust time of the processing container 51 was 60 sec. In this way, the above-described film forming process was performed by repeating the cycle of alternately carrying out the step of supplying the Ru raw material gas and the step of exhausting the interior of the processing container 51 nine times.

Under the above-described conditions, the step of forming the Ru film and the step of exhausting the interior of the processing container 51 were alternately carried out until the Ru film 4 was embedded in the recess 3. Next, an image of a vertical cross section of the wafer 100 after the film forming process was acquired by the same method as in the example. This image is shown in FIG. 7B.

Figure 7B:
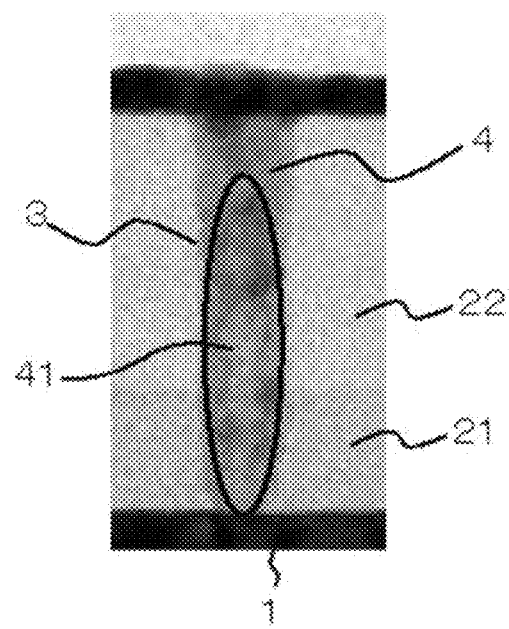
FIG. 7B is an explanatory view showing an image acquired in an evaluation test according to a comparative example.

In the image shown in FIG. 7B, a white region showing a void 41 can be seen inside the Ru film 4 embedded in the recess 3, whereas in the image shown in FIG. 7A, there is no portion suggesting the formation of the void in the Ru film 4 embedded in the recess 3. As a result, it was confirmed that, for a recess 3 that has a high aspect ratio and includes a bottom surface on which a metal is exposed and a side wall which is formed by an insulating film, it is possible to embed Ru in the recess while suppressing generation of a void by using Ru$_3$(CO)$_{12}$ gas with the method of the present disclosure.

According to the present disclosure, when embedding ruthenium in a recess formed in the surface of a substrate, it is possible to form a ruthenium film on the substrate while suppressing the generation of a void.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a ruthenium film on a surface of a substrate in order to embed ruthenium in a recess formed in the surface of the substrate, the method comprising:
   depositing ruthenium by supplying a ruthenium raw material gas to the substrate under a preset first pressure; and
   depositing the ruthenium by supplying the ruthenium raw material gas to the substrate under a preset second pressure, which is lower than the first pressure,
   wherein the first pressure is a pressure in a range of 13.3 Pa to 20.0 Pa, and the second pressure is a pressure in a range of 0.6 Pa to 2.2 Pa,
   wherein a growth rate of a ruthenium film in the recess in the depositing the ruthenium under the first pressure is lower than a growth rate of a ruthenium film in the recess in the depositing the ruthenium under the second pressure, and the ruthenium film formed in the depositing the ruthenium under the first pressure in the recess is thinner than the ruthenium film formed in the depositing the ruthenium under the second pressure in the recess,
   wherein the ruthenium film is embedded in the recess by alternately repeating the depositing the ruthenium under the first pressure and the depositing the ruthenium under the second pressure.

2. The method of claim 1, further comprising:
   removing, from the surface of the substrate, the ruthenium raw material gas supplied to the substrate between the depositing the ruthenium under the first pressure and the depositing the ruthenium under the second pressure.

3. The method of claim 2, wherein the recess is formed by removing a portion of an insulating film formed on the surface of the substrate, and a metal formed at a lower layer side of the insulating film is exposed on a bottom surface of the recess.

4. The method of claim 3, wherein the ruthenium raw material gas is dodecacarbonyl triruthenium gas.

5. The method of claim 1, wherein the recess is formed by removing a portion of an insulating film formed on the surface of the substrate, and a metal formed at a lower layer side of the insulating film is exposed on a bottom surface of the recess.

6. The method of claim 1, wherein the ruthenium raw material gas is dodecacarbonyl triruthenium gas.

* * * * *